(12) United States Patent
Haig et al.

(10) Patent No.: US 10,777,262 B1
(45) Date of Patent: Sep. 15, 2020

(54) READ DATA PROCESSING CIRCUITS AND METHODS ASSOCIATED MEMORY CELLS

(71) Applicant: GSI Technology, Inc., Sunnyvale, CA (US)

(72) Inventors: Bob Haig, Sunnyvale, CA (US); Eli Ehrman, Sunnyvale, CA (US); Chao-Hung Chang, Sunnyvale, CA (US); Mu-Hsiang Huang, Sunnyvale, CA (US)

(73) Assignee: GSI Technology, Inc., Sunnyvale, CA (US)

( * ) Notice: Subject to any disclaimer, the term of this patent is extended or adjusted under 35 U.S.C. 154(b) by 0 days.

(21) Appl. No.: 16/111,178

(22) Filed: Aug. 23, 2018

Related U.S. Application Data

(63) Continuation-in-part of application No. 15/709,399, filed on Sep. 19, 2017, and a continuation-in-part of application No. 15/709,401, filed on Sep. 19, 2017, now Pat. No. 10,249,362, and a continuation-in-part of application No. 15/709,379, filed on Sep. 19, 2017, now Pat. No. 10,521,229, and a continuation-in-part of application No. 15/709,382, filed on Sep. 19, 2017, and a continuation-in-part of application No. 15/709,385, filed on Sep. 19, 2017, now Pat. No. 10,725,777.

(60) Provisional application No. 62/430,767, filed on Dec. 6, 2016, provisional application No. 62/430,762, filed on Dec. 6, 2016.

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ..... G11C 11/41; G11C 11/419; G11C 11/413; G11C 11/412; G11C 11/416
USPC .............................................. 365/154, 189.15
See application file for complete search history.

(56) References Cited

U.S. PATENT DOCUMENTS

| | | | |
|---|---|---|---|
| 3,451,694 A | 6/1969 | Hass | |
| 3,747,952 A | 7/1973 | Graebe | |
| 3,795,412 A | 3/1974 | John | |
| 4,227,717 A | 10/1980 | Bouvier | |
| 4,308,505 A | 12/1981 | Messerschmitt | |
| 4,587,496 A | 5/1986 | Wolaver | |
| 4,594,564 A | 6/1986 | Yarborough, Jr. | |
| 4,677,394 A | 6/1987 | Vollmer | |

(Continued)

FOREIGN PATENT DOCUMENTS

| | | |
|---|---|---|
| CN | 104752431 | 7/2015 |
| JP | 2005-346922 | 12/2005 |

OTHER PUBLICATIONS

US 10,564,982 B1, 02/2020, Oh et al. (withdrawn)

*Primary Examiner* — Alfredo Bermudez Lozada
(74) *Attorney, Agent, or Firm* — DLA Piper LLP

(57) ABSTRACT

A read register is provided that captures and stores the read result on a read bit line connected to a set of computational memory cells. The read register may be implemented in the set of computational memory cell to enable the logical XOR, logical AND, and/or logical OR accumulation of read results in the read register. The set of computational memory cells with the read register provides a mechanism for performing complex logical functions across multiple computational memory cells connected to the same read bit line.

33 Claims, 10 Drawing Sheets

(56) References Cited

U.S. PATENT DOCUMENTS

| | | |
|---|---|---|
| 4,716,322 A | 12/1987 | D'Arrigo et al. |
| 4,741,006 A | 4/1988 | Yamaguchi et al. |
| 4,856,035 A | 8/1989 | Lewis |
| 5,008,636 A | 4/1991 | Markinson |
| 5,302,916 A | 4/1994 | Pritchett |
| 5,375,089 A | 12/1994 | Lo |
| 5,382,922 A | 1/1995 | Gersbach |
| 5,400,274 A | 3/1995 | Jones |
| 5,473,574 A | 12/1995 | Clemen et al. |
| 5,530,383 A | 6/1996 | May |
| 5,535,159 A | 7/1996 | Nii |
| 5,563,834 A | 10/1996 | Longway et al. |
| 5,587,672 A | 12/1996 | Ranganathan et al. |
| 5,608,354 A | 3/1997 | Hori |
| 5,661,419 A | 8/1997 | Bhagwan |
| 5,696,468 A | 12/1997 | Nise |
| 5,736,872 A | 4/1998 | Sharma et al. |
| 5,744,979 A | 4/1998 | Goetting |
| 5,744,991 A | 4/1998 | Jefferson et al. |
| 5,748,044 A | 5/1998 | Xue |
| 5,768,559 A | 6/1998 | Iino et al. |
| 5,805,912 A | 9/1998 | Johnson et al. |
| 5,883,853 A | 3/1999 | Zheng et al. |
| 5,937,204 A | 8/1999 | Schinnerer |
| 5,942,949 A | 8/1999 | Wilson et al. |
| 5,963,059 A | 10/1999 | Partovi et al. |
| 5,969,576 A | 10/1999 | Trodden |
| 5,969,986 A | 10/1999 | Wong |
| 5,977,801 A | 11/1999 | Boerstler |
| 5,999,458 A | 12/1999 | Nishimura et al. |
| 6,058,063 A | 5/2000 | Jang |
| 6,072,741 A | 6/2000 | Taylor |
| 6,100,721 A | 8/2000 | Durec et al. |
| 6,100,736 A | 8/2000 | Wu et al. |
| 6,114,920 A | 9/2000 | Moon et al. |
| 6,115,320 A | 9/2000 | Mick et al. |
| 6,133,770 A | 10/2000 | Hasegawa |
| 6,167,487 A | 12/2000 | Camacho |
| 6,175,282 B1 | 1/2001 | Yasuda |
| 6,226,217 B1 | 5/2001 | Riedlinger et al. |
| 6,262,937 B1 | 7/2001 | Arcoleo et al. |
| 6,263,452 B1 | 7/2001 | Jewett et al. |
| 6,265,902 B1 | 7/2001 | Klemmer et al. |
| 6,286,077 B1 | 9/2001 | Choi et al. |
| 6,366,524 B1 | 4/2002 | Abedifard |
| 6,377,127 B1 | 4/2002 | Fukaishi et al. |
| 6,381,684 B1 | 4/2002 | Hronik et al. |
| 6,385,122 B1 | 5/2002 | Chang |
| 6,407,642 B2 | 6/2002 | Dosho et al. |
| 6,418,077 B1 | 7/2002 | Naven |
| 6,441,691 B1 | 8/2002 | Jones et al. |
| 6,448,757 B2 | 9/2002 | Hill |
| 6,473,334 B1 | 10/2002 | Bailey et al. |
| 6,483,361 B1 | 11/2002 | Chiu |
| 6,504,417 B1 | 1/2003 | Cecchi et al. |
| 6,538,475 B1 | 3/2003 | Johansen et al. |
| 6,567,338 B1 | 5/2003 | Mick |
| 6,594,194 B2 | 7/2003 | Gold |
| 6,642,747 B1 | 11/2003 | Chiu |
| 6,661,267 B2 | 12/2003 | Walker et al. |
| 6,665,222 B2 | 12/2003 | Wright et al. |
| 6,683,502 B1 | 1/2004 | Groen et al. |
| 6,683,930 B1 | 1/2004 | Dalmia |
| 6,732,247 B2 | 5/2004 | Berg et al. |
| 6,744,277 B1 | 6/2004 | Chang et al. |
| 6,757,854 B1 | 6/2004 | Zhao |
| 6,789,209 B1 | 9/2004 | Suzuki et al. |
| 6,816,019 B2 | 11/2004 | Delbo' et al. |
| 6,838,951 B1 | 1/2005 | Nieri et al. |
| 6,842,396 B2 | 1/2005 | Kono |
| 6,853,696 B1 | 2/2005 | Moser et al. |
| 6,854,059 B2 | 2/2005 | Gardner |
| 6,856,202 B2 | 2/2005 | Lesso |
| 6,859,107 B1 | 2/2005 | Moon et al. |
| 6,882,237 B2 | 4/2005 | Singh et al. |
| 6,897,696 B2 | 5/2005 | Chang et al. |
| 6,933,789 B2 | 8/2005 | Molnar et al. |
| 6,938,142 B2 | 8/2005 | Pawlowski |
| 6,940,328 B2 | 9/2005 | Lin |
| 6,954,091 B2 | 10/2005 | Wurzer |
| 6,998,922 B2 | 2/2006 | Jensen et al. |
| 7,002,404 B2 | 2/2006 | Gaggl et al. |
| 7,002,416 B2 | 2/2006 | Pettersen et al. |
| 7,003,065 B2 | 2/2006 | Homol et al. |
| 7,017,090 B2 | 3/2006 | Endou et al. |
| 7,019,569 B2 | 3/2006 | Fan-Jiang |
| 7,042,271 B2 | 5/2006 | Chung et al. |
| 7,042,792 B2 | 5/2006 | Lee |
| 7,042,793 B2 | 5/2006 | Masuo |
| 7,046,093 B1 | 5/2006 | McDonagh et al. |
| 7,047,146 B2 | 5/2006 | Chuang et al. |
| 7,053,666 B2 | 5/2006 | Tak et al. |
| 7,095,287 B2 | 8/2006 | Maxim et al. |
| 7,099,643 B2 | 8/2006 | Lin |
| 7,141,961 B2 | 11/2006 | Hirayama et al. |
| 7,142,477 B1 | 11/2006 | Tran et al. |
| 7,152,009 B2 | 12/2006 | Bokui et al. |
| 7,180,816 B2 | 2/2007 | Park |
| 7,200,713 B2 | 4/2007 | Cabot et al. |
| 7,218,157 B2 | 5/2007 | Van De Beek et al. |
| 7,233,214 B2 | 6/2007 | Kim et al. |
| 7,246,215 B2 | 7/2007 | Lu et al. |
| 7,263,152 B2 | 8/2007 | Miller et al. |
| 7,269,402 B2 | 9/2007 | Uozumi et al. |
| 7,282,999 B2 | 10/2007 | Da Dalt et al. |
| 7,312,629 B2 | 12/2007 | Chuang et al. |
| 7,313,040 B2 | 12/2007 | Chuang et al. |
| 7,330,080 B1 | 2/2008 | Stoiber et al. |
| 7,340,577 B1 | 3/2008 | Van Dyke et al. |
| 7,349,515 B1 | 3/2008 | Chew et al. |
| 7,352,249 B2 | 4/2008 | Balboni et al. |
| 7,355,482 B2 | 4/2008 | Meltzer |
| 7,355,907 B2 | 4/2008 | Chen et al. |
| 7,369,000 B2 | 5/2008 | Wu et al. |
| 7,375,593 B2 | 5/2008 | Self |
| 7,389,457 B2 | 6/2008 | Chen et al. |
| 7,439,816 B1 | 10/2008 | Lombaard |
| 7,463,101 B2 | 12/2008 | Tung |
| 7,464,282 B1 | 12/2008 | Abdollahi-Alibeik et al. |
| 7,487,315 B2 | 2/2009 | Hur et al. |
| 7,489,164 B2 | 2/2009 | Madurawe |
| 7,512,033 B2 | 3/2009 | Hur et al. |
| 7,516,385 B2 | 4/2009 | Chen et al. |
| 7,538,623 B2 | 5/2009 | Jensen et al. |
| 7,545,223 B2 | 6/2009 | Watanabe |
| 7,565,480 B2 | 7/2009 | Ware et al. |
| 7,577,225 B2 | 8/2009 | Azadet et al. |
| 7,592,847 B2 | 9/2009 | Liu et al. |
| 7,595,657 B2 | 9/2009 | Chuang et al. |
| 7,622,996 B2 | 11/2009 | Liu |
| 7,630,230 B2 | 12/2009 | Wong |
| 7,633,322 B1 | 12/2009 | Zhuang et al. |
| 7,635,988 B2 | 12/2009 | Madurawe |
| 7,646,215 B2 | 1/2010 | Chuang et al. |
| 7,646,648 B2 | 1/2010 | Arsovski |
| 7,659,783 B2 | 2/2010 | Tai |
| 7,660,149 B2 | 2/2010 | Liaw |
| 7,663,415 B2 | 2/2010 | Chatterjee et al. |
| 7,667,678 B2 | 2/2010 | Guttag |
| 7,675,331 B2 | 3/2010 | Jung et al. |
| 7,719,329 B1 | 5/2010 | Smith |
| 7,719,330 B2 | 5/2010 | Lin et al. |
| 7,728,675 B1 | 6/2010 | Kennedy et al. |
| 7,737,743 B1 | 6/2010 | Gao et al. |
| 7,746,181 B1 | 6/2010 | Moyal |
| 7,746,182 B2 | 6/2010 | Ramaswamy et al. |
| 7,750,683 B2 | 7/2010 | Huang et al. |
| 7,760,032 B2 | 7/2010 | Ardehali |
| 7,760,040 B2 | 7/2010 | Zhang et al. |
| 7,760,532 B2 | 7/2010 | Shirley et al. |
| 7,782,655 B2 | 8/2010 | Shau |
| 7,812,644 B2 | 10/2010 | Cha et al. |
| 7,830,212 B2 | 11/2010 | Lee et al. |
| 7,839,177 B1 | 11/2010 | Soh |

(56) References Cited

U.S. PATENT DOCUMENTS

| | | |
|---|---|---|
| 7,843,239 B2 | 11/2010 | Sohn et al. |
| 7,843,721 B1 | 11/2010 | Chou |
| 7,848,725 B2 | 12/2010 | Zolfaghari et al. |
| 7,859,919 B2 | 12/2010 | De La Cruz, II et al. |
| 7,876,163 B2 | 1/2011 | Hachigo |
| 7,916,554 B2 | 3/2011 | Pawlowski |
| 7,920,409 B1 | 4/2011 | Clark |
| 7,920,665 B1 | 4/2011 | Lombaard |
| 7,924,599 B1 | 4/2011 | Evans, Jr. et al. |
| 7,940,088 B1 | 5/2011 | Sampath et al. |
| 7,944,256 B2 | 5/2011 | Masuda |
| 7,956,695 B1 | 6/2011 | Ding et al. |
| 7,965,108 B2 | 6/2011 | Liu et al. |
| 8,004,920 B2 | 8/2011 | Ito et al. |
| 8,008,956 B1 | 8/2011 | Shin et al. |
| 8,044,724 B2 | 10/2011 | Rao et al. |
| 8,063,707 B2 | 11/2011 | Wang |
| 8,087,690 B2 | 1/2012 | Kim |
| 8,089,819 B2 | 1/2012 | Noda |
| 8,117,567 B2 | 2/2012 | Arsovski |
| 8,174,332 B1 | 5/2012 | Lombaard et al. |
| 8,218,707 B2 | 7/2012 | Mai |
| 8,242,820 B2 | 8/2012 | Kim |
| 8,258,831 B1 | 9/2012 | Banai |
| 8,284,593 B2 | 10/2012 | Russell |
| 8,294,502 B2 | 10/2012 | Lewis et al. |
| 8,400,200 B1 | 3/2013 | Shu et al. |
| 8,488,408 B1 | 7/2013 | Shu et al. |
| 8,493,774 B2 | 7/2013 | Kung |
| 8,526,256 B2 * | 9/2013 | Ghosh .................. G11C 11/412 365/203 |
| 8,542,050 B2 | 9/2013 | Chuang et al. |
| 8,575,982 B1 | 11/2013 | Shu et al. |
| 8,593,860 B2 | 11/2013 | Shu et al. |
| 8,625,334 B2 | 1/2014 | Liaw |
| 8,643,418 B2 | 2/2014 | Ma et al. |
| 8,692,621 B2 | 4/2014 | Snowden et al. |
| 8,693,236 B2 | 4/2014 | Shu |
| 8,817,550 B1 | 8/2014 | Oh |
| 8,837,207 B1 | 9/2014 | Jou |
| 8,885,439 B1 | 11/2014 | Shu et al. |
| 8,971,096 B2 | 3/2015 | Jung et al. |
| 8,995,162 B2 | 3/2015 | Sang |
| 9,018,992 B1 | 4/2015 | Shu et al. |
| 9,030,893 B2 | 5/2015 | Jung |
| 9,053,768 B2 | 6/2015 | Shu et al. |
| 9,059,691 B2 | 6/2015 | Lin |
| 9,070,477 B1 | 6/2015 | Clark |
| 9,083,356 B1 | 7/2015 | Cheng |
| 9,093,135 B2 | 7/2015 | Khailany |
| 9,094,025 B1 | 7/2015 | Cheng |
| 9,135,986 B2 | 9/2015 | Shu |
| 9,142,285 B2 | 9/2015 | Hwang et al. |
| 9,159,391 B1 | 10/2015 | Shu et al. |
| 9,171,634 B2 | 10/2015 | Zheng |
| 9,177,646 B2 | 11/2015 | Arsovski |
| 9,196,324 B2 | 11/2015 | Haig et al. |
| 9,240,229 B1 | 1/2016 | Oh et al. |
| 9,311,971 B1 | 4/2016 | Oh |
| 9,318,174 B1 | 4/2016 | Chuang et al. |
| 9,356,611 B1 | 5/2016 | Shu et al. |
| 9,384,822 B2 | 7/2016 | Shu et al. |
| 9,385,032 B2 | 7/2016 | Shu |
| 9,396,790 B1 | 7/2016 | Chhabra |
| 9,401,200 B1 | 7/2016 | Chan |
| 9,412,440 B1 | 8/2016 | Shu et al. |
| 9,413,295 B1 | 8/2016 | Chang |
| 9,431,079 B1 | 8/2016 | Shu et al. |
| 9,443,575 B2 | 9/2016 | Yabuuchi |
| 9,484,076 B1 | 11/2016 | Shu et al. |
| 9,494,647 B1 | 11/2016 | Chuang et al. |
| 9,552,872 B2 | 1/2017 | Jung |
| 9,608,651 B1 | 3/2017 | Cheng |
| 9,613,670 B2 | 4/2017 | Chuang et al. |
| 9,613,684 B2 | 4/2017 | Shu et al. |
| 9,640,540 B1 | 5/2017 | Liaw |
| 9,679,631 B2 | 6/2017 | Haig et al. |
| 9,685,210 B1 | 6/2017 | Ghosh et al. |
| 9,692,429 B1 | 6/2017 | Chang |
| 9,697,890 B1 | 7/2017 | Wang |
| 9,722,618 B1 | 8/2017 | Cheng |
| 9,729,159 B1 | 8/2017 | Cheng |
| 9,789,840 B2 | 10/2017 | Farooq |
| 9,804,856 B2 | 10/2017 | Oh et al. |
| 9,847,111 B2 | 12/2017 | Shu et al. |
| 9,853,633 B1 | 12/2017 | Cheng et al. |
| 9,853,634 B2 | 12/2017 | Chang |
| 9,859,902 B2 | 1/2018 | Chang |
| 9,916,889 B1 | 3/2018 | Duong |
| 9,935,635 B2 | 4/2018 | Chuang et al. |
| 9,966,118 B2 | 5/2018 | Shu et al. |
| 10,065,594 B2 | 9/2018 | Fukawatase |
| 10,153,042 B2 | 12/2018 | Ehrman |
| 10,192,592 B2 | 1/2019 | Shu et al. |
| 10,249,362 B2 | 4/2019 | Shu |
| 10,425,070 B2 | 9/2019 | Chen et al. |
| 10,535,381 B2 | 1/2020 | Shu et al. |
| 10,659,058 B1 | 5/2020 | Cheng et al. |
| 2001/0052822 A1 | 12/2001 | Kim et al. |
| 2002/0006072 A1 | 1/2002 | Kunikiyo |
| 2002/0060938 A1 | 5/2002 | Song |
| 2002/0154565 A1 | 10/2002 | Noh et al. |
| 2002/0168935 A1 | 11/2002 | Han |
| 2003/0016689 A1 | 1/2003 | Hoof |
| 2003/0107913 A1 | 6/2003 | Nii |
| 2003/0185329 A1 | 10/2003 | Dickmann |
| 2004/0053510 A1 | 3/2004 | Little |
| 2004/0062138 A1 | 4/2004 | Partsch et al. |
| 2004/0090413 A1 | 5/2004 | Yoo |
| 2004/0160250 A1 | 8/2004 | Kim et al. |
| 2004/0169565 A1 | 9/2004 | Gaggl et al. |
| 2004/0199803 A1 | 10/2004 | Suzuki et al. |
| 2004/0240301 A1 | 12/2004 | Rao |
| 2004/0264279 A1 | 12/2004 | Wordeman |
| 2004/0264286 A1 | 12/2004 | Ware et al. |
| 2005/0024912 A1 | 2/2005 | Chen et al. |
| 2005/0026329 A1 | 2/2005 | Kim et al. |
| 2005/0036394 A1 | 2/2005 | Shiraishi |
| 2005/0186930 A1 | 8/2005 | Rofougaran et al. |
| 2005/0226079 A1 | 10/2005 | Zhu et al. |
| 2005/0226357 A1 | 10/2005 | Yoshimura |
| 2005/0253658 A1 | 11/2005 | Maeda et al. |
| 2005/0285862 A1 | 12/2005 | Noda |
| 2006/0039227 A1 | 2/2006 | Lai et al. |
| 2006/0055434 A1 | 3/2006 | Tak et al. |
| 2006/0119443 A1 | 6/2006 | Azam et al. |
| 2006/0139105 A1 | 6/2006 | Maxim et al. |
| 2006/0143428 A1 | 6/2006 | Noda |
| 2006/0248305 A1 | 11/2006 | Fang |
| 2007/0001721 A1 | 1/2007 | Chen et al. |
| 2007/0047283 A1 | 3/2007 | Miyanishi |
| 2007/0058407 A1 | 3/2007 | Dosaka et al. |
| 2007/0109030 A1 | 5/2007 | Park |
| 2007/0115739 A1 | 5/2007 | Huang |
| 2007/0139997 A1 | 6/2007 | Suzuki |
| 2007/0171713 A1 | 7/2007 | Hunter |
| 2007/0189101 A1 | 8/2007 | Lambrache et al. |
| 2007/0229129 A1 | 10/2007 | Nakagawa |
| 2008/0010429 A1 | 1/2008 | Rao |
| 2008/0049484 A1 | 2/2008 | Sasaki |
| 2008/0068096 A1 | 3/2008 | Feng et al. |
| 2008/0079467 A1 | 4/2008 | Hou et al. |
| 2008/0080230 A1 | 4/2008 | Liaw |
| 2008/0117707 A1 | 5/2008 | Manickavasakam |
| 2008/0129402 A1 | 6/2008 | Han et al. |
| 2008/0155362 A1 | 6/2008 | Chang et al. |
| 2008/0175039 A1 | 7/2008 | Thomas |
| 2008/0181029 A1 | 7/2008 | Joshi et al. |
| 2008/0265957 A1 | 10/2008 | Luong et al. |
| 2009/0027947 A1 | 1/2009 | Takeda |
| 2009/0089646 A1 | 4/2009 | Hirose |
| 2009/0154257 A1 | 6/2009 | Fujioka et al. |
| 2009/0161468 A1 | 6/2009 | Fujioka |
| 2009/0231943 A1 | 9/2009 | Kunce et al. |

(56) References Cited

U.S. PATENT DOCUMENTS

| | | |
|---|---|---|
| 2009/0256642 A1 | 10/2009 | Lesso |
| 2009/0296869 A1 | 12/2009 | Chao et al. |
| 2009/0319871 A1 | 12/2009 | Shirai et al. |
| 2010/0085086 A1 | 4/2010 | Nedovic et al. |
| 2010/0157715 A1 | 6/2010 | Pyeon |
| 2010/0169675 A1 | 7/2010 | Kajihara |
| 2010/0172190 A1 | 7/2010 | Lavi |
| 2010/0177571 A1 | 7/2010 | Shori et al. |
| 2010/0214815 A1 | 8/2010 | Tam |
| 2010/0232202 A1 | 9/2010 | Lu |
| 2010/0260001 A1 | 10/2010 | Kasprak et al. |
| 2010/0271138 A1 | 10/2010 | Thakur et al. |
| 2010/0322022 A1 | 12/2010 | Shinozaki et al. |
| 2011/0018597 A1 | 1/2011 | Lee et al. |
| 2011/0063898 A1 | 3/2011 | Ong |
| 2011/0153932 A1 | 6/2011 | Ware et al. |
| 2011/0267914 A1 | 11/2011 | Ish Iku Ra |
| 2011/0280307 A1 | 11/2011 | Macinnis et al. |
| 2011/0292743 A1 | 12/2011 | Zimmerman |
| 2011/0299353 A1 | 12/2011 | Ito et al. |
| 2012/0049911 A1 | 3/2012 | Ura |
| 2012/0133114 A1 | 5/2012 | Choi |
| 2012/0153999 A1 | 6/2012 | Kim |
| 2012/0242382 A1 | 9/2012 | Tsuchiya et al. |
| 2012/0243347 A1 | 9/2012 | Sampigethaya |
| 2012/0250440 A1 | 10/2012 | Wu |
| 2012/0327704 A1 | 12/2012 | Chan |
| 2013/0039131 A1 | 2/2013 | Haig et al. |
| 2013/0083591 A1 | 4/2013 | Wuu |
| 2013/0170289 A1 | 7/2013 | Grover et al. |
| 2014/0056093 A1 | 2/2014 | Tran et al. |
| 2014/0125390 A1 | 5/2014 | Ma |
| 2014/0136778 A1 | 5/2014 | Khailany et al. |
| 2014/0185366 A1 | 7/2014 | Chandwani et al. |
| 2014/0269019 A1 | 9/2014 | Kolar |
| 2015/0003148 A1 | 1/2015 | Iyer et al. |
| 2015/0029782 A1 | 1/2015 | Jung |
| 2015/0063052 A1 | 3/2015 | Manning |
| 2015/0187763 A1 | 7/2015 | Kim et al. |
| 2015/0213858 A1 | 7/2015 | Tao |
| 2015/0248927 A1 | 9/2015 | Fujiwara |
| 2015/0279453 A1 | 10/2015 | Fujiwars |
| 2015/0302917 A1 | 10/2015 | Grover |
| 2015/0310901 A1 | 10/2015 | Jung |
| 2015/0357028 A1 | 12/2015 | Huang et al. |
| 2016/0005458 A1 | 1/2016 | Shu et al. |
| 2016/0027500 A1 | 1/2016 | Chuang et al. |
| 2016/0064068 A1 | 3/2016 | Mojumder |
| 2016/0141023 A1 | 5/2016 | Jung |
| 2016/0225436 A1 | 8/2016 | Wang |
| 2016/0225437 A1 | 8/2016 | Kumar |
| 2016/0284392 A1 | 9/2016 | Block et al. |
| 2016/0329092 A1 | 11/2016 | Akerib |
| 2017/0194046 A1 | 7/2017 | Yeung, Jr. et al. |
| 2017/0345505 A1 | 11/2017 | Noel et al. |
| 2018/0122456 A1 | 5/2018 | Li |
| 2018/0123603 A1 | 5/2018 | Chang |
| 2018/0157621 A1 | 6/2018 | Shu et al. |
| 2018/0158517 A1 | 6/2018 | Shu et al. |
| 2018/0158518 A1 | 6/2018 | Shu et al. |
| 2018/0158519 A1 | 6/2018 | Shu et al. |
| 2018/0158520 A1 | 6/2018 | Shu |
| 2020/0117398 A1 | 4/2020 | Haig et al. |

\* cited by examiner

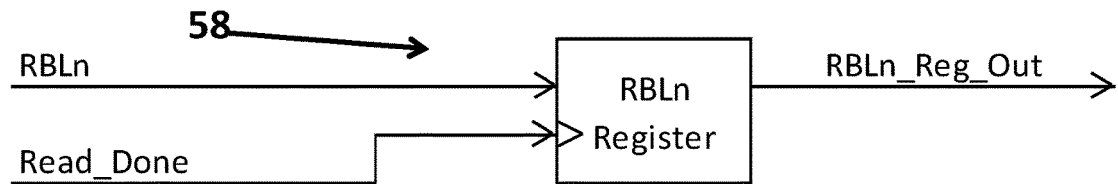
FIGURE 6
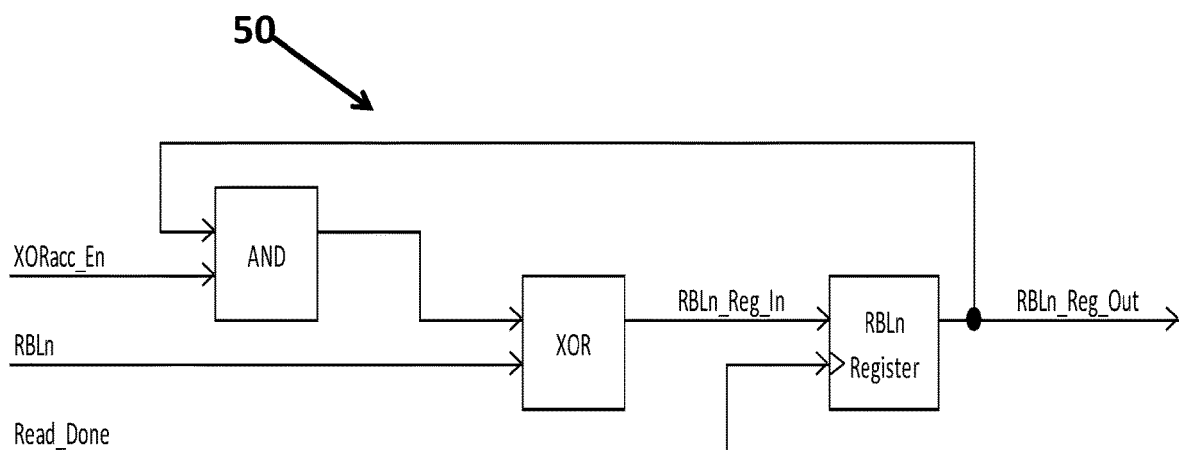
FIGURE 7
| Read Logic Input | | | Read Logic Output | |
|---|---|---|---|---|
| XORacc_En | RBLn | RBLn_Reg_Out | RBLn_Reg_In | Logical Result |
| 0 | 0 | X | 0 | RBLn |
| 0 | 1 | X | 1 | RBLn |
| 1 | 0 | 0 | 0 | RBLn XOR RBLn_Reg_Out |
| 1 | 0 | 1 | 1 | RBLn XOR RBLn_Reg_Out |
| 1 | 1 | 0 | 1 | RBLn XOR RBLn_Reg_Out |
| 1 | 1 | 1 | 0 | RBLn XOR RBLn_Reg_Out |
FIGURE 8

| Read Logic Input | | | Read Logic Output | |
| --- | --- | --- | --- | --- |
| ANDacc_En | RBLn | RBLn_Reg_Out | RBLn_Reg_In | Logical Result |
| 0 | 0 | X | 0 | RBLn |
| 0 | 1 | X | 1 | RBLn |
| 1 | 0 | 0 | 0 | RBLn AND RBLn_Reg_Out |
| 1 | 0 | 1 | 0 | RBLn AND RBLn_Reg_Out |
| 1 | 1 | 0 | 0 | RBLn AND RBLn_Reg_Out |
| 1 | 1 | 1 | 1 | RBLn AND RBLn_Reg_Out |

| Read Logic Input | | | Read Logic Output | |
|---|---|---|---|---|
| ORacc_En | RBLn | RBLn_Reg_Out | RBLn_Reg_In | Logical Result |
| 0 | 0 | X | 0 | RBLn |
| 0 | 1 | X | 1 | RBLn |
| 1 | 0 | 0 | 0 | RBLn OR RBLn_Reg_Out |
| 1 | 0 | 1 | 1 | RBLn OR RBLn_Reg_Out |
| 1 | 1 | 0 | 1 | RBLn OR RBLn_Reg_Out |
| 1 | 1 | 1 | 1 | RBLn OR RBLn_Reg_Out |

| Read Logic Input | | | | | Read Logic Output | |
|---|---|---|---|---|---|---|
| XORacc_En | ANDacc_En | ORacc_En | RBLn | RBLn_Reg_Out | RBLn_Reg_In | Logical Result |
| 0 | 0 | 0 | 0 | X | 0 | RBLn |
| | | | 1 | X | 1 | |
| 1 | 0 | 0 | 0 | 0 | 0 | RBLn XOR RBLn_Reg_Out |
| | | | 0 | 1 | 1 | |
| | | | 1 | 0 | 1 | |
| | | | 1 | 1 | 0 | |
| 0 | 1 | 0 | 0 | 0 | 0 | RBLn AND RBLn_Reg_Out |
| | | | 0 | 1 | 0 | |
| | | | 1 | 0 | 0 | |
| | | | 1 | 1 | 1 | |
| 0 | 0 | 1 | 0 | 0 | 0 | RBLn OR RBLn_Reg_Out |
| | | | 0 | 1 | 1 | |
| | | | 1 | 0 | 1 | |
| | | | 1 | 1 | 1 | |
| 1 | 1 | 0 | 0 | 0 | 0 | NOT(RBLn) AND RLBn_Reg_Out |
| | | | 0 | 1 | 1 | |
| | | | 1 | 0 | 0 | |
| | | | 1 | 1 | 0 | |
| 1 | 0 | 1 | 0 | 0 | 0 | RBLn AND NOT(RBLn_Reg_Out) |
| | | | 0 | 1 | 0 | |
| | | | 1 | 0 | 1 | |
| | | | 1 | 1 | 0 | |
| 0 | 1 | 1 | 0 | 0 | 0 | RBLn_Reg_Out |
| | | | 0 | 1 | 1 | |
| | | | 1 | 0 | 0 | |
| | | | 1 | 1 | 1 | |
| 1 | 1 | 1 | X | X | 0 | 0 |

FIGURE 14

READ DATA PROCESSING CIRCUITS AND METHODS ASSOCIATED MEMORY CELLS

PRIORITY CLAIM/RELATED APPLICATIONS

This application is a continuation in part of and claims priority under 35 USC 120 to U.S. patent application Ser. No. 15/709,399, filed Sep. 19, 2017 and entitled "Computational Dual Port Sram Cell And Processing Array Device Using The Dual Port Sram Cells For Xor And Xnor Computations", U.S. patent application Ser. No. 15/709,401, filed Sep. 19, 2017 and entitled "Computational Dual Port Sram Cell And Processing Array Device Using The Dual Port Sram Cells For Xor And Xnor Computations", U.S. patent application Ser. No. 15/709,379, filed Sep. 19, 2017 and entitled "Computational Dual Port Sram Cell And Processing Array Device Using The Dual Port Sram Cells", U.S. patent application Ser. No. 15/709,382, filed Sep. 19, 2017 and entitled "Computational Dual Port Sram Cell And Processing Array Device Using The Dual Port Sram Cells", and U.S. patent application Ser. No. 15/709,385, filed Sep. 19, 2017 and entitled "Computational Dual Port Sram Cell And Processing Array Device Using The Dual Port Sram Cells" that in turn claim priority under 35 USC 119(e) and 120 and claim the benefit of U.S. Provisional Patent Application No. 62/430,767, filed Dec. 6, 2016 and entitled "Computational Dual Port Sram Cell And Processing Array Device Using The Dual Port Sram Cells For Xor And Xnor Computations" and U.S. Provisional Patent Application No. 62/430,762, filed Dec. 6, 2016 and entitled "Computational Dual Port Sram Cell And Processing Array Device Using The Dual Port Sram Cells", the entirety of all of which are incorporated herein by reference.

FIELD

The disclosure relates generally to a computational memory element and in particular to a computational memory element having a read accumulator.

BACKGROUND

Memory cells have traditionally been used to store bits of data. It is also possible to architect a memory cell so that the memory cell is able to perform some simple logical functions when multiple memory cells are connected to the same read bit line. For example, when memory cells A, B, and C are connected to a particular read bit line and are read simultaneously, and the memory cells and read bit line circuitry are designed to produce a logical AND result, then the result that appears on the read bit line is AND(a,b,c) (i.e. "a AND b AND c"), where a, b, and c represent the binary data values stored in memory cells A, B, and C respectively.

By themselves, these computational memory cells and read bit line circuitry allow for a single logical function (e.g. AND) to be performed across multiple memory cells connected to the same read bit line, when read simultaneously. However, in many cases more complex logical functions across multiple memory cells connected to the same read bit line are desirable. Thus, it is desirable to provide additional circuitry associated with each read bit line that facilitates the more complex logical functions and it is to this end that the disclosure is directed.

BRIEF DESCRIPTION OF THE DRAWINGS

FIG. 6 illustrates an example of the storage in each bit line read/write logic;

FIG. 7 illustrates a first embodiment of the read accumulator circuitry in each bit line read/write logic;

FIG. 8 is a truth table showing the operation of the first embodiment of the read accumulator circuitry in each bit line read/write logic;

FIG. 14 is a truth table showing the operation of the fourth embodiment of the read accumulator circuitry in each bit line read/write logic.

DETAILED DESCRIPTION OF ONE OR MORE EMBODIMENTS

The disclosure is particularly applicable to a processing array, semiconductor memory or computer that utilizes a plurality of computational memory cells (with each cell being formed with a static random access memory (SRAM) cell) and additional read circuitry to provide more complex logical functions based on the data read out of the computational memory cells and it is in this context that the disclosure will be described. It will be appreciated, however, that each memory cell may be other types of volatile and non-volatile memory cell that are within the scope of the disclosure, that other additional read circuitry (including more, less or different logic) may be used to output different logic functions are within the scope of the disclosure or that different computational memory cell architectures that those disclosed below are within the scope of the disclosure. For example, the different logic functions may include XNOR, NAND and NOR which are the inverted functions of the exemplary logic functions and those inverted functions are within the scope of the disclosure.

The disclosure includes an implementation and utilization of a "read register" to capture and store the read result on the read bit line connected to a set of computational memory cells and an implementation and utilization of circuitry providing the input to the read register that enables the logical XOR, logical AND, and/or logical OR accumulation of read results in the read register. The purpose is to provide a mechanism for performing complex logical functions across multiple computational memory cells connected to the same read bit line over multiple read operations.

Figure 1:
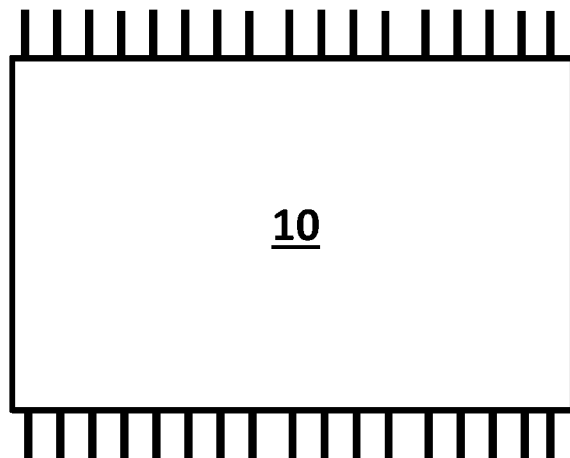
FIG. 1 illustrates an example of a semiconductor memory that may include a plurality of computation memory cells and a read accumulator.
Figure 2:
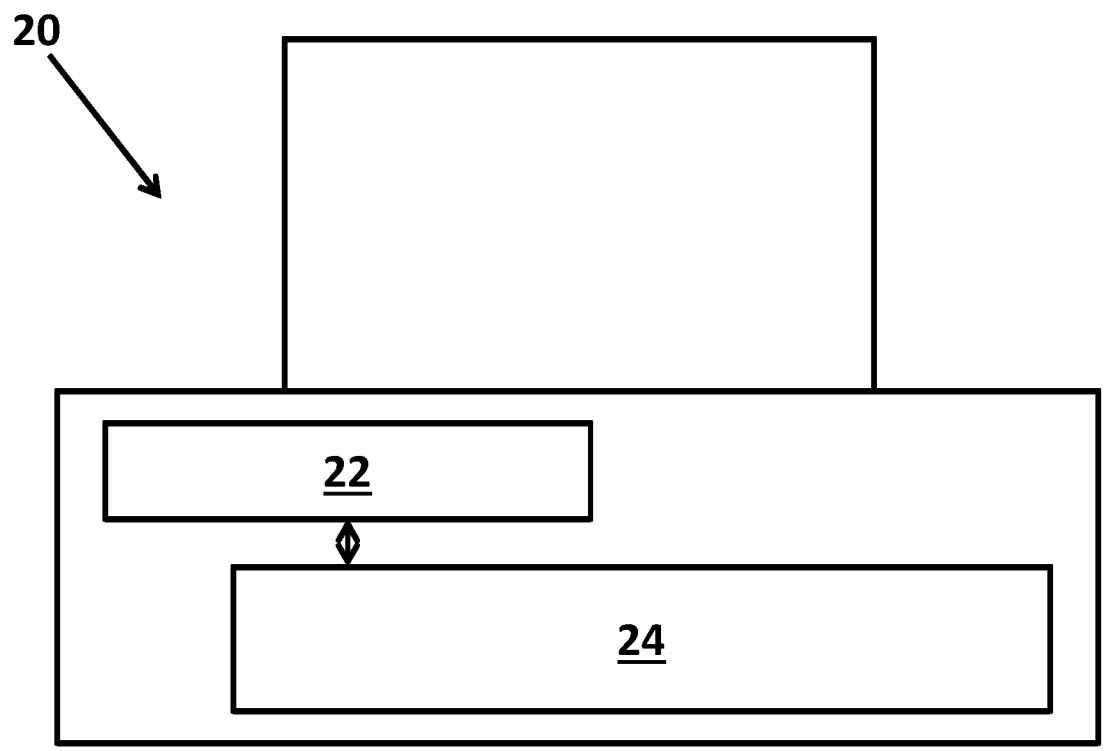
FIG. 2 illustrates an example of a computer system that may include a plurality of computation memory cells and a read accumulator.

FIG. 1 illustrates an example of a semiconductor memory 10 that may include a plurality of computation memory cells and a read accumulator that are described below in more detail. The below disclosed plurality of computation memory cells and a read accumulator allow the semiconductor memory 10 to perform more complex logic functions than is possible with just the plurality of computation memory cells. FIG. 2 illustrates an example of a computer system 20 that may include a plurality of computation memory cells and a read accumulator that are described below in more detail. The below disclosed plurality of computation memory cells and a read accumulator allow the semiconductor memory 20 to perform more complex logic functions than is possible with just the plurality of computation memory cells. The computer system 20 may have at least one processor 22 and a memory 24 that may include the plurality of computation memory cells and a read accumulator.

Figure 3:
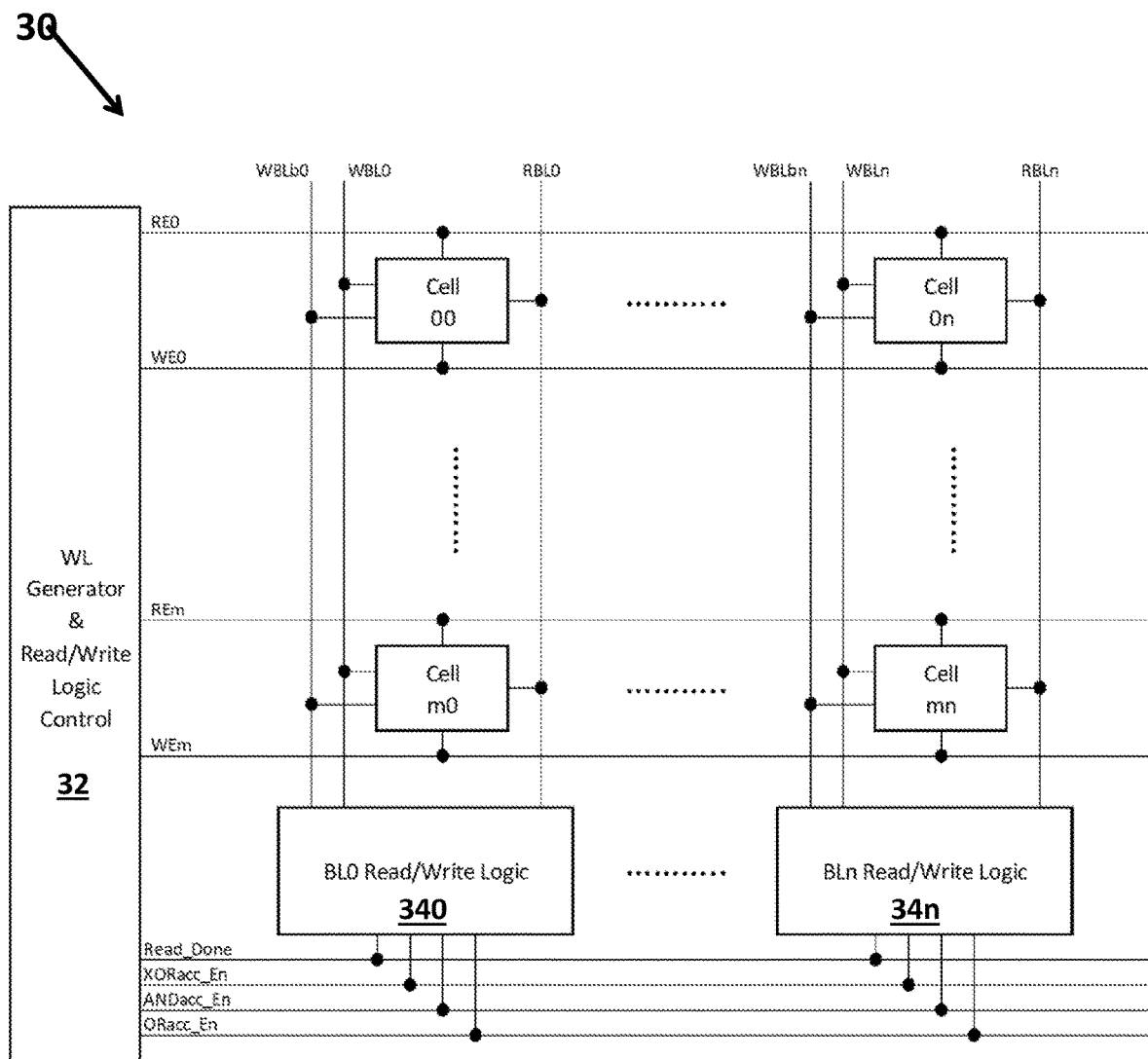
FIG. 3 illustrates an example of a processing array with computational memory cells that may be incorporated into a semiconductor memory or computer system.

FIG. 3 illustrates an example of a processing array 30 with computational memory cells in an array that may be incorporated into a semiconductor memory or computer system. The processing array 30 may include an array of computational memory cells (cell 00, . . . , cell 0n and cell m0, . . . , cell mn). In one embodiment, the array of computational memory cells may be rectangular as shown in FIG. 3 and may have a plurality of columns and a plurality of rows wherein the computational memory cells in a particular column may also be connected to the same read bit line. The processing array 30 may further include a wordline (WL) generator and read/write logic control circuit 32 that may be connected to and generate signals for the read word line (RE) and write word line (WE) for each memory cell (such as RE0, . . . , REn and WE0, . . . , WEn) and one more read/write blocks 34 that are connected to the read and write bit lines of the computational memory cells. In the embodiment shown in FIG. 3, the processing array may have a read/write circuitry 34 for each set of bit line signals of the computational memory cells. For example, BL0 read/write logic 340 may be coupled to the read and write bit lines (WBLb0, WBL0 and RBL0) for the computational memory cells in column 0 of the array and BLn read/write logic 34n may be coupled to the read and write bit lines (WBLbn, WBLn and RBLn) for the computational memory cells in column n of the array as shown in FIG. 3.

The wordline (WL) generator and read/write logic control circuit 32 may also generate one or more control signals that control the read/write circuitry 34. For example, for the different embodiments of the read/write logic described below with reference to FIGS. 6-14, the one or more control signals may include a Read_Done control signal, an XORacc_En control signal, an ANDacc_En control signal and an ORacc_En control signal. Note that for each different embodiment, a different one or more of the control signals is used so that the wordline (WL) generator and read/write logic control circuit 32 may generate different control signals for each embodiment or the wordline (WL) generator and read/write logic control circuit 32 may generate each of the control signals, but then only certain of the control signals (FIGS. 6-12) or all of the control signals (FIGS. 13-14) may be utilized. In one embodiment, a "0" logic level of a control signal is an inactive control signal and a "1" logic level of a control signal is an active control signal.

During a read operation, the wordline (WL) generator and read/write logic control circuit 32 may activate one or more word lines that activate one or more computational memory cells so that the read bit lines of those one or more computational memory cells may be read out. Further details of the read operation are not provided here since the read operation is well known.

Figure 4A:
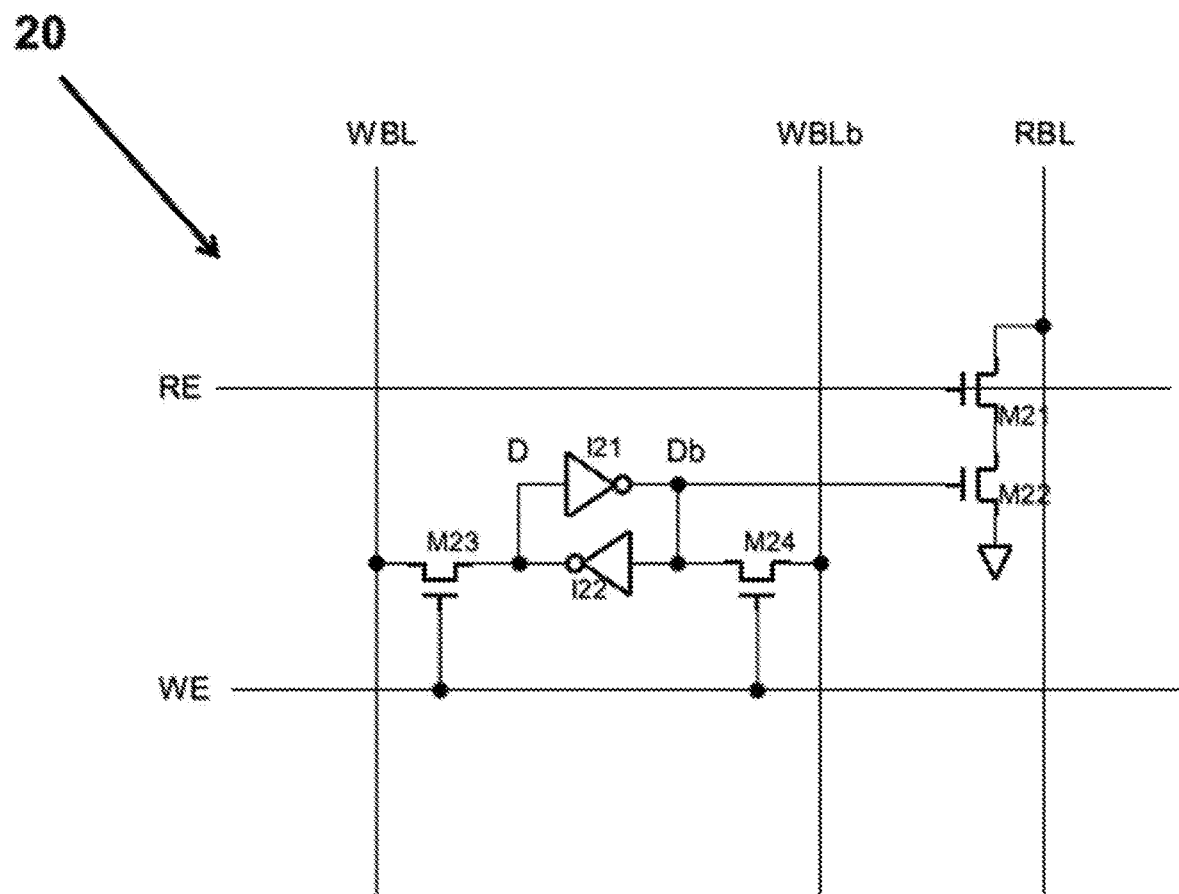
FIGS. 4A and 4B illustrate examples of two different types of computational memory cells that may be used in the semiconductor memory of FIG. 1, the computer system of FIG. 2 or the processing array of FIG. 3.
Figure 4B:
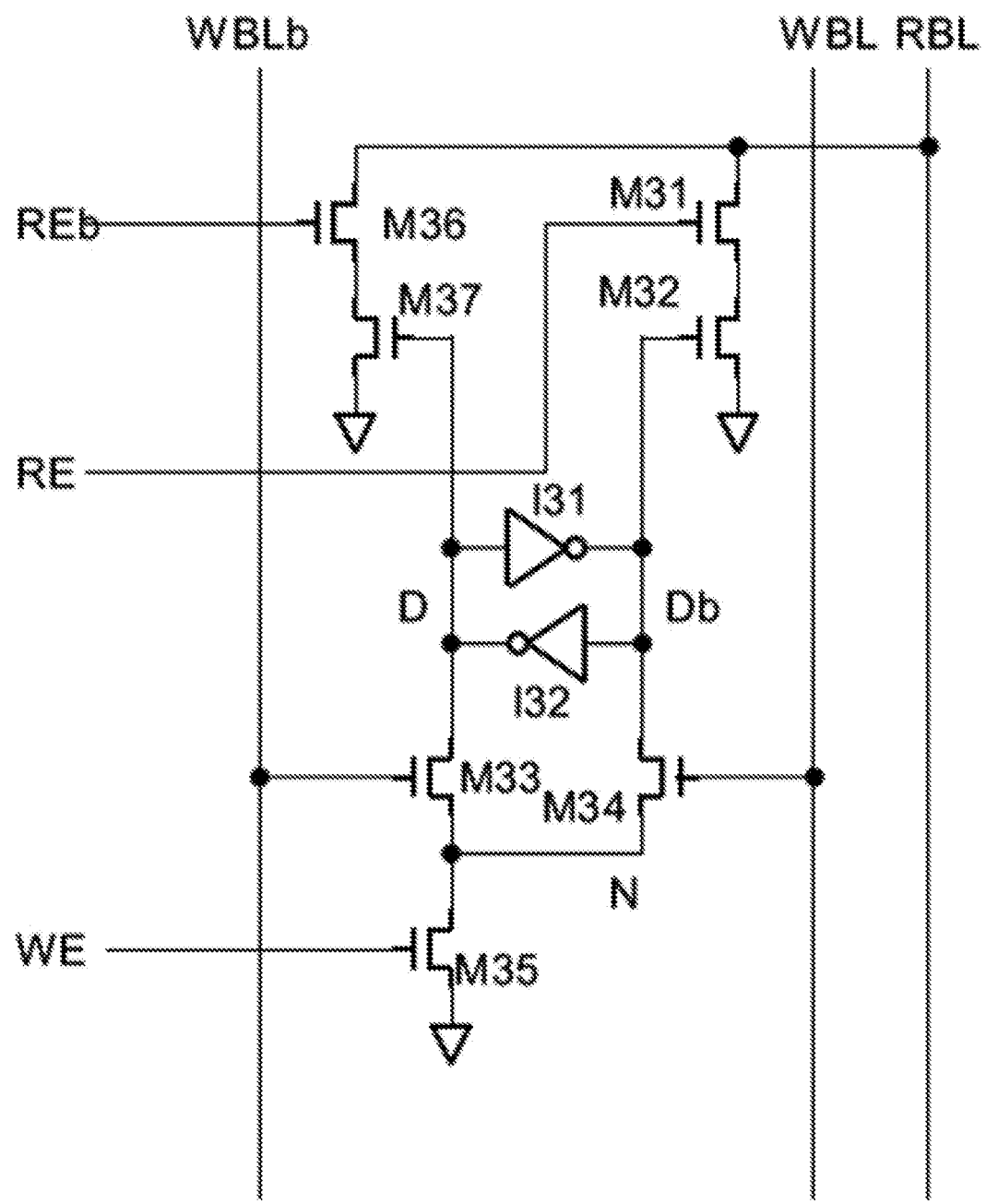

FIGS. 4A and 4B illustrate examples of two different types of computational memory cells that may be used in the semiconductor memory of FIG. 1, the computer system of FIG. 2 or the processing array of FIG. 3. In the examples, the computational memory cell are based on an SRAM memory cell.

FIG. 4A illustrates an example of a dual port SRAM cell 20 that may be used for computation. The dual port SRAM cell may include two cross coupled inverters I21, I22 and two access transistors M23 and M24 that interconnected together as shown in FIG. 2 to form a 6T SRAM cell. The SRAM may be operated as storage latch and may have a write port. The two inverters are cross coupled since the input of the first inverter is connected to the output of the second inverter and the output of the first inverter is coupled to the input of the second inverter as shown in FIG. 4A. A Write Word line carries a signal and is called WE (see FIG. 2) and a write bit line and its complement are called WBL and WBLb, respectively. The Write word line WE is coupled to the gates of the two access transistors M23, M24 that are part of the SRAM cell. The write bit line and its complement (WBL and WBLb) are each coupled to one side of the respective access transistors M23, M24 as shown in FIG. 4A while the other side of each of those access transistors M23, M24 are coupled to each side of the cross coupled inverters (labeled D and Db in FIG. 4A.)

The circuit in FIG. 4A may also have a read word line RE, a read bit line RBL and a read port formed by transistors M21, M22 coupled together to form as isolation circuit as shown. The read word line RE may be coupled to the gate of transistor M21 that forms part of the read port while the read bit line is coupled to the source terminal of transistor M21. The gate of transistor M22 may be coupled to the Db output from the cross coupled inverters I21, I22.

During reading, multiple cells (with only a single cell being shown in FIG. 4A) can turn on to perform an AND function. Specifically, at the beginning of the read cycle, RBL is pre-charged high and if the Db signal of all cells that are turned on by RE is "0", then RBL stays high since, although the gate of transistor M21 is turned on by the RE signal, the gate of M22 is not turned on and the RBL line is not connected to the ground to which the drain of transistor M22 is connected. If the Db signal of any or all of the cells is "1" then RBL is discharged to 0 since the gate of M22 is turned on and the RBL line is connected to ground. As a result, RBL=NOR (Db0, Db1, etc.) where Db0, Db1, etc. are the complementary data of the SRAM cells that have been turned on by the RE signal. Alternatively, RBL=NOR (Db0, Db1, etc.)=AND (D0, D1, etc.), where D0, D1, etc. are the true data of the cells that have been turned on by the RE signal.

As shown in FIG. 4A, the Db signal of the cell 20 may be coupled to a gate of transistor M22 to drive the RBL. However, unlike the typical 6T cell, the Db signal is isolated from the RBL line and its signal/voltage level by the transistors M21, M22. Because the Db signal/value is isolated from the RBL line and signal/voltage level, the Db signal is not susceptive to the lower bit line level caused by multiple "0" data stored in multiple cells in contrast to the typical SRAM cell. Therefore, for the cell in FIG. 4A, there is no limitation of how many cells can be turned on to drive RBL. As a result, the cell (and the device made up for multiple cells) offers more operands for the AND function since there is no limit of how many cells can be turned on to drive RBL. Furthermore, in the cell in FIG. 4A, the RBL line is pre-charged (not a static pull up transistor as with the typical 6T cell) so this cell can provide much faster sensing because the current generated by the cell is all be used to discharge the bit line capacitance with no current being consumed by a static pull up transistor so that the bit line discharging rate can be faster by more than 2 times. The sensing for the disclosed cell is also lower power without the extra current consumed by a static pull up transistor and the discharging current is reduced by more than half.

The write port of the cell in FIG. 4A is operated in the same manner as the 6T typical SRAM cell described above. As a result, the write cycle and Selective Write cycle for the cell has the same limitation as a typical 6T cell. In addition to the AND function described above, the SRAM cell 20 in FIG. 4A also may perform a NOR function by storing inverted data. Specifically, if D is stored at the gate of M22, instead of Db, then RBL=NOR (D0, D1, etc.). One skilled in the art understand that the cell configuration shown in FIG. 4A would be slightly altered to achieve this, but that modification is within the scope of the disclosure. Further details of this exemplary computational memory cell is found in co-pending U.S. patent application Ser. Nos. 15/709,379, 15/709,382 and 15/709,385 all filed on Sep. 19, 2017 and entitled "Computational Dual Port Sram Cell And Processing Array Device Using The Dual Port Sram Cells" which are incorporated herein by reference.

FIG. 4B illustrates an implementation of a dual port SRAM cell 100 with an XOR function. The dual port SRAM cell 100 may include two cross coupled inverters I31, I32 and two access transistors M33 and M34 that are interconnected together as shown in FIG. 4B to form the basic SRAM cell. The SRAM may be operated as storage latch and may have a write port. The two inverters I31, I32 are cross coupled since the input of the first inverter is connected to the output of the second inverter (labeled D) and the output of the first inverter (labeled Db) is coupled to the input of the second inverter as shown in FIG. 4B. The cross coupled inverters I31, I32 form the latch of the SRAM cell. The access transistor M33 and M34 may have their respective gates connected to write bit line and its complement (WBL, WBLb) respectively. A Write Word line carries a signal WE. The Write word line WE is coupled to the gate of a transistor M35 that is part of the access circuitry for the SRAM cell.

The circuit in FIG. 4B may also have a read word line RE, a read bit line RBL and a read port formed by transistors M31, M32 coupled together to form as isolation circuit as shown. The read word line RE may be coupled to the gate of transistor M31 that forms part of the read port while the read bit line RBL is coupled to the drain terminal of transistor M31. The gate of transistor M32 may be coupled to the Db output from the cross coupled inverters I31, I32. The isolation circuit isolates the latch output Db (in the example in FIG. 4B) from the read bit line and signal/voltage level so that the Db signal is not susceptive to the lower bit line level caused by multiple "0" data stored in multiple cells in contrast to the typical SRAM cell.

The cell 100 may further include two more read word line transistors M36, M37 and one extra complementary read word line, REb. When the read port is active, either RE or REb is high and the REb signal/voltage level is the complement of RE signal/voltage level. RBL is pre-charged high, and if one of (M31, M32) or (M36, M37) series transistors is on, RBL is discharged to 0. If none of (M31, M32) or (M36, M37) series transistors is on, then RBL stay high as 1 since it was precharged high. The following equation below, where D is the data stored in the cell and Db is the complement data stored in the cell, describes the functioning/operation of the cell:

$$RBL=AND(NAND(RE,Db),NAND(REb,D))=XNOR(RE,D) \quad (EQ1)$$

If the word size is 8, then it needs to be stored in 8 cells (with one cell being shown in FIG. 4B) on the same bit line. On a search operation, an 8 bit search key can be entered using the RE, REb lines of eight cells to compare the search key with cell data. If the search key bit is 1, then the corresponding RE=1 and REb=0 for that cell. If the search key bit is 0, then the corresponding RE=0 and REb=1. If all 8 bits match the search key, then RBL will be equal to 1. IF any 1 of the 8 bits is not matched, then RBL will be discharged and be 0. Therefore, this cell 100 (when used with 7 other cells for an 8 bit search key) can perform the same XNOR function but uses half the number of cell as the typical SRAM cell. The following equation for the multiple bits on the bit line may describe the operation of the cells as:

$$RBL=AND(XNOR(RE1,D1),XNOR(RE2,D2), \ldots ,XNOR(REi,Di)), \text{ where } i \text{ is the number of active cell.} \quad (EQ2)$$

By controlling either RE or REb to be a high signal/on, the circuit 100 may also be used to do logic operations mixing true and complement data as shown below:

$$RBL=AND(D1,D2, \ldots ,Dn,Dbn+1,Dbn+2, \ldots Dbm) \quad (EQ3)$$

where D1, D2, . . . Dn are "n" number of data with RE on and Dbn+1, Dbn+2, . . . Dbm are m-n number of data with REb on.

Furthermore, if the cell 100 stores inverse data, meaning WBL and WBLb shown in FIG. 4B is swapped, then the logic equation EQ1 becomes XOR function and logic equation EQ3 becomes NOR a function and can be expressed as EQ 4 and EQ5

$$RBL=XOR(RE,D) \quad (EQ4)$$

$$RBL=NOR(D1,D2, \ldots ,Dn,Dbn+1,Dbn+2, \ldots Dbm) \quad (EQ5)$$

where D1, D2, . . . Dn are n number of data with RE on and Dbn+1, Dbn+2, . . . Dbm are m-n number of data with REb on.

In another embodiment, the read port of the circuit 100 is FIG. 4B may be reconfigured differently to achieve different Boolean equation. Specifically, transistors M31, M32, M36 and M37 may be changed to PMOS and the source of M32 and M37 is VDD instead of VSS, the bit line is pre-charged to 0 instead of 1 and the word line RE active state is 0. In this embodiment, the logic equations EQ1 is inverted so that RBL is an XOR function of RE and D (EQ6). EQ3 is rewritten as an OR function (EQ7) as follows:

$$RBL=XOR(RE,D) \quad (EQ6)$$

$$RBL=OR(D1,D2, \ldots ,Dn,Dbn+1,Dbn+2, \ldots Dbm) \quad (EQ7)$$

where D1, D2, . . . Dn are n number of data with RE on and Dbn+1, Dbn+2, . . . Dbm are m-n number of data with REb on.

If the cell stores the inverse data of the above discussed PMOS read port, meaning WBL and WBLb is swapped, then $$RBL=XNOR(RE,D) \quad (EQ8)$$

$$RBL=NAND(D1,D2, \ldots ,Dn,Dbn+1,Dbn+2, \ldots Dbm) \quad (EQ9)$$

where D1, D2, . . . Dn are n number of data with RE on and Dbn+1, Dbn+2, . . . Dbm are m-n number of data with REb on.

For example, consider a search operation where a digital word needs to be found in a memory array in which the memory array can be configured as each bit of the word stored on the same bit line. To compare 1 bit of the word, then the data is stored in a cell and its RE is the search key Key, then EQ1 can be written as below:

$$RBL=XNOR(Key,D) \quad\quad\quad EQ10$$

If Key=D, then RBL=1. If the word size is 8 bits as D[0:7], then the search key Key[0:7] is its RE, then EQ2 can be expressed as search result and be written as below:

$$RBL=AND(XNOR(Key[0],D[0]),XNOR(Key[1],D[1]),\ldots,Key[7],D[7]) \quad EQ11$$

If all Key[i] is equal to D[i] where i=0-7, then the search result RBL is match. Any one of Key[i] is not equal to D[i], then the search result is not match. Parallel search can be performed in 1 operation by arranging multiple data words along the same word line and on parallel bit lines with each word on 1 bit line. Further details of this computation memory cell may be found in U.S. patent application Ser. Nos. 15/709,399 and 15/709,401 both filed on Sep. 19, 2017 and entitled "Computational Dual Port Sram Cell And Processing Array Device Using The Dual Port Sram Cells For Xor And Xnor Computations", which are incorporated herein by reference.

Figure 5:
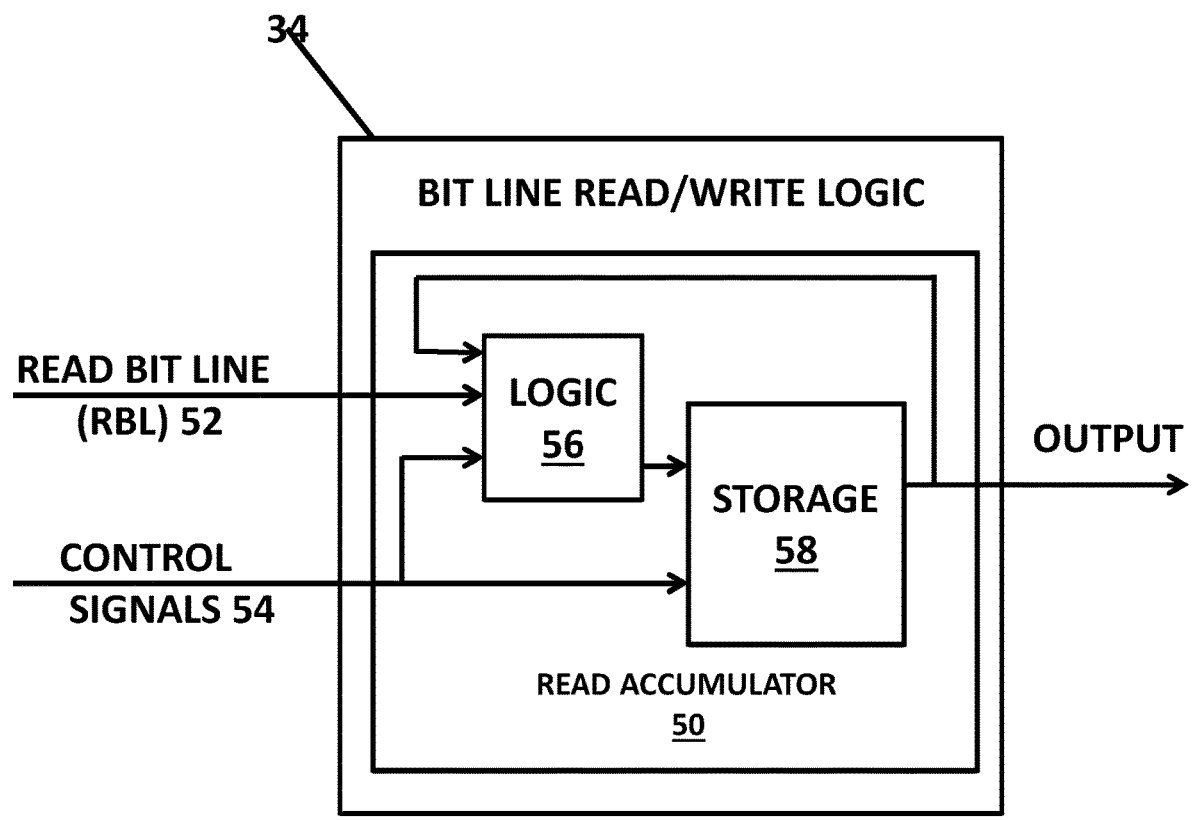
FIG. 5 illustrates more details of each bit line read/write logic that may be part of the semiconductor memory of FIG. 1, the computer system of FIG. 2 or the processing array of FIG. 3.

FIG. 5 illustrates more details of each bit line read/write logic 34 that may be part of the semiconductor memory of FIG. 1, the computer system of FIG. 2 or the processing array of FIG. 3. Each bit line read/write logic 34 may include read accumulator circuitry 50 that receives read bit lines (RBL) signals 52 from the plurality of active computational memory cells connected to the bit line read/write logic 34 (such as cell 00, . . . , cell m0 in column 0 of the array as shown in FIG. 3) and one or more control signals 54 from the wordline (WL) generator and read/write logic control circuit 32. Different embodiments of the read accumulator circuits 50 are shown in FIGS. 6, 7, 9, 11 and 13.

The read accumulator circuitry 50 may include one or more accumulation circuits 56 and a storage circuit 58. The output of the storage circuit may be the more complex logic function that may be produced using the disclosed plurality of computational memory cells and the read accumulator circuitry. In different embodiments, the read accumulator circuitry 50 may receive as input the read bit line signals 52 and one or more control signals to accumulation circuits 56 that output a signal that is fed to the storage circuitry 58 along with the one or more control signals 54 and the storage circuitry 58 outputs the complex logic function as described below with reference to FIGS. 7, 9, 11 and 13 (although note that the different embodiments use different ones of the one or more control signals). Also, as shown in FIG. 5, the output from the storage 58 may be fed back as an input to the accumulation circuits 56.

FIG. 6 illustrates an example of the storage 58 in each bit line read/write logic. As described above, one technique to generate more complex logical functions across multiple memory cells connected to the same read bit line is to "accumulate" read results over multiple read operations. To facilitate such accumulation, the storage circuitry 58 may be a read register (constructed as a D flip-flop in one implementation) that is implemented on each read bit line (shown as RBLn Register in FIG. 6). The read register is loaded with a new read result from the read bit line at the end of each read operation to one or more computational memory cells connected to the read bit line (RBLn in FIG. 6). This is accomplished by driving a "Read_Done" signal (one of the control signals) from low to high after each read operation (i.e. after the read bit line has reached the correct state associated with the read operation). The Read Done signal is used to clock the read bit line result ("RBLn") into the read register. The read register outputs the results (the RBLn_Reg_Out signal) shown in FIG. 6.

Once the read accumulator (including for example, the read register) is implemented on the read bit line, further circuitry is added to provide a mechanism to "accumulate" read results in the read register. Specifically, the output of the read register (i.e. the result of a previous read operation), referred to as "RBLn_Reg_Out", is fed back into the accumulation circuitry 56 that combines it with the read bit line result of a new read operation, and the combined result (rather than just the read bit line result itself) is latched into the read register at the end of the new read operation as discussed below with reference to FIGS. 7-14.

XOR Accumulation Circuitry

FIG. 7 illustrates a first embodiment of the read accumulator circuitry 50 in each bit line read/write logic that incorporates both accumulation circuitry 56 and storage circuitry 58 (shown implemented as the RBLn Register in this embodiment.) In this embodiment, the "accumulation" circuitry 56 (implemented using an AND gate and an XOR gate connected as shown in FIG. 7) is "XOR accumulation" circuitry. In this embodiment, an "XORacc_En" control signal (that is generated by the wordline (WL) generator and read/write logic control circuit 32 for example in FIG. 3) is used to enable XOR accumulation with a previous read result, when the "XORacc_En" control signal is driven active/High concurrently with a new read operation. For the XOR accumulation:

The read bit line result "RBLn" is the first data input to the XOR accumulation circuitry.

The read register output "RBLn_Reg_Out" is the second data input to the XOR accumulation circuitry when the AND gate is enabled by the "XORacc_En" control signal.

The data output of the XOR accumulation circuitry (RBLn_Reg_In) is the data input to the read register along with the control signal Read_Done whose function was described above.

As evident from the Truth Table associated with circuitry in FIG. 7, as depicted in FIG. 8, when a read operation is performed with XORacc_En=0, the read register is loaded with the read bit line result "RBLn". And when a read operation is performed with XORacc_En=1, the read register is loaded with the read bit line result "RBLn" logically XORed with the previous read result (or accumulated read result) stored in the read register, "RBLn_Reg_Out" since the RBLn_Reg_Out signal is fed back to an input of the XOR logic gate. The AND logic gate is controlled by the XORacc_En control signal and controls when previous read result is fed to the XOR logic gate.

The net result of such accumulation is best illustrated by an example. Suppose the computational memory cells and read bit line circuitry are designed to perform a logical AND across multiple memory cells connected to the same read bit line, when read simultaneously (an example of these computational memory cells is shown in FIG. 4A). And suppose the read register+XOR accumulation circuitry in FIG. 7 is implemented in conjunction with the read bit line. In that case, the following sequence of three read operations to memory cells A~F connected to the same read bit line produces the following results:

| Read #1: Read A, B with XORacc_En = 0. | Result: RBLn_Reg_Out = a AND b. |
|---|---|
| Read #2: Read C with XORacc_En = 1. | Result: RBLn_Reg_Out = (a AND b) XOR c. |
| Read #3: Read D, E, F with XORacc_En = 1. | Result: RBLn_Reg_Out = (a AND b) XOR c XOR (d AND e AND f). |

AND Accumulation Circuitry

Figures 9, 10:
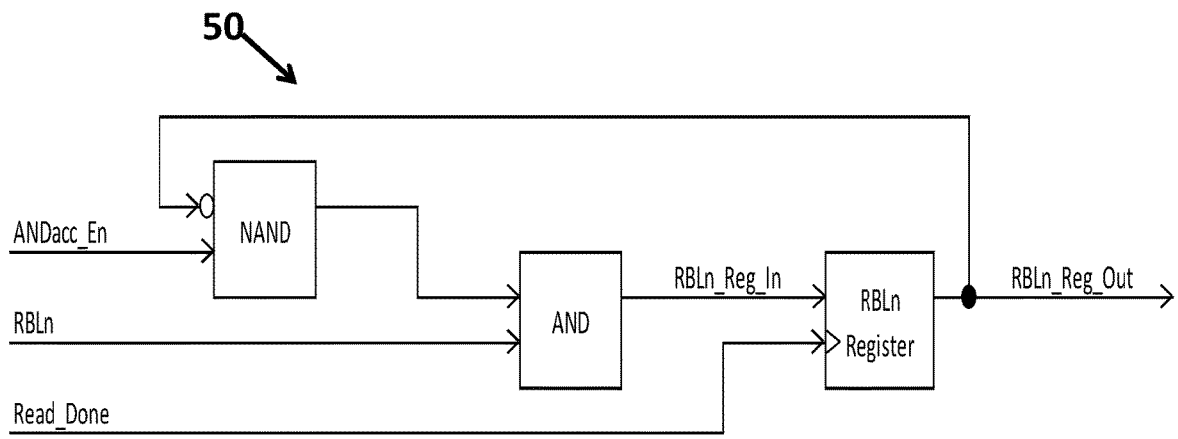
FIG. 9 illustrates a second embodiment of the read accumulator circuitry in each bit line read/write logic.
FIG. 10 is a truth table showing the operation of the second embodiment of the read accumulator circuitry in each bit line read/write logic.

FIG. 9 illustrates a second embodiment of the read accumulator circuitry 50 in each bit line read/write logic and FIG. 10 is a truth table showing the operation of the second embodiment of the read accumulator circuitry in each bit line read/write logic. In this embodiment, the read accumulator circuitry 56 (implemented with a NAND gate and an AND gate connected as shown in FIG. 9) is "AND accumulation" circuitry. In this embodiment, an "ANDacc_En" control signal is used to enable AND accumulation with a previous read result, when it is driven active/High concurrently with a new read operation. For the AND accumulation:

The read bit line result "RBLn" is the first data input to the AND accumulation circuitry.
The read register output "RBLn_Reg_Out" is the second data input to the AND accumulation circuitry.
The data output of the AND accumulation circuitry is the data input to the read register.

As evident from the Truth Table associated with FIG. 9, as depicted in FIG. 10, when a read operation is performed with ANDacc_En=0 (the control signal being inactive which turns off the AND accumulation due to the NAND gate), the read register is loaded with the read bit line result "RBLn". And when a read operation is performed with ANDacc_En=1 (the control signal being active which enables the AND accumulation), the read register is loaded with the read bit line result "RBLn" logically ANDed with the previous read result (or accumulated read result) stored in the read register, "RBLn_Reg_Out" that is fed back to the AND gate through the NAND gate.

For example, in this case, the computational memory cells and read bit line circuitry are designed to perform a logical OR across multiple memory cells connected to the same read bit line, when read simultaneously and the read register+AND accumulation circuitry in FIG. 9 is implemented in conjunction with the read bit line. In that case, the following sequence of three read operations to memory cells A~F connected to the same read bit line produces the following results:

| Read #1: Read A, B with ANDacc_En = 0. | Result: RBLn_Reg_Out = a OR b. |
|---|---|
| Read #2: Read C with ANDacc_En = 1. | Result: RBLn_Reg_Out = (a OR b) AND C. |
| Read #3: Read D, E, F with ANDacc_En = 1. | Result: RBLn_Reg_Out = (a OR b) AND c AND (d OR e OR f). |

OR Accumulation Circuitry

Figures 11, 12:
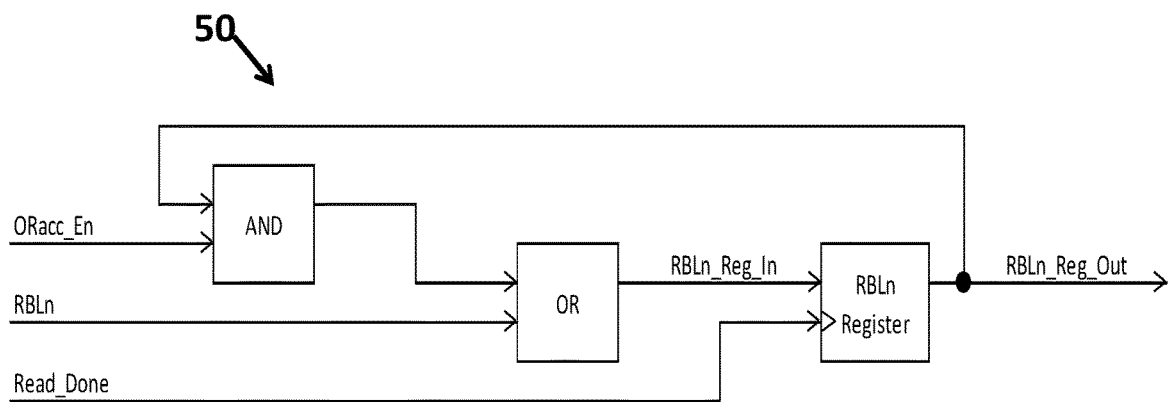
FIG. 11 illustrates a third embodiment of the read accumulator circuitry in each bit line read/write logic.
FIG. 12 is a truth table showing the operation of the third embodiment of the read accumulator circuitry in each bit line read/write logic.

FIG. 11 illustrates a third embodiment of the read accumulator circuitry 50 in each bit line read/write logic and FIG. 12 is a truth table showing the operation of the third embodiment of the read accumulator circuitry in each bit line read/write logic. In this embodiment, the read accumulation circuitry 56 (implemented using an AND gate and an OR gate connected as shown in FIG. 11) is "OR accumulation" circuitry. In this embodiment, an "ORacc_En" control signal is used to enable OR accumulation (using the AND gate) with a previous read result, when it is driven active/High concurrently with a new read operation. In an OR accumulation:

The read bit line result "RBLn" is the first data input to the OR accumulation circuitry.
The read register output "RBLn_Reg_Out" is the second data input to the OR accumulation circuitry.
The data output of the OR accumulation circuitry is the data input to the read register.

As evident from the Truth Table associated with FIG. 11, as depicted in FIG. 12, when a read operation is performed with ORacc_En=0 (OR accumulation not enabled), the read register is loaded with the read bit line result "RBLn". And when a read operation is performed with ORacc_En=1, the read register is loaded with the read bit line result "RBLn" logically ORed with the previous read result (or accumulated read result) stored in the read register, "RBLn_Reg_Out".

For example, in this case, the computational memory cells and read bit line circuitry are designed to perform a logical AND across multiple memory cells connected to the same read bit line, when read simultaneously and the read register+OR accumulation circuitry in FIG. 11 is implemented in conjunction with the read bit line. In that case, the following sequence of three read operations to memory cells A~F connected to the same read bit line produces the following results:

| Read #1: Read A, B with ORacc_En = 0. | Result: RBLn_Reg_Out = a AND b. |
|---|---|
| Read #2: Read C with ORacc_En = 1. | Result: RBLn_Reg_Out = (a AND b) OR c. |
| Read #3: Read D, E, F with ORacc_En = 1. | Result: RBLn_Reg_Out = (a AND b) OR c OR (d AND e AND f). |

XOR Accumulation, AND Accumulation, and OR Accumulation Circuitry

Figure 13:
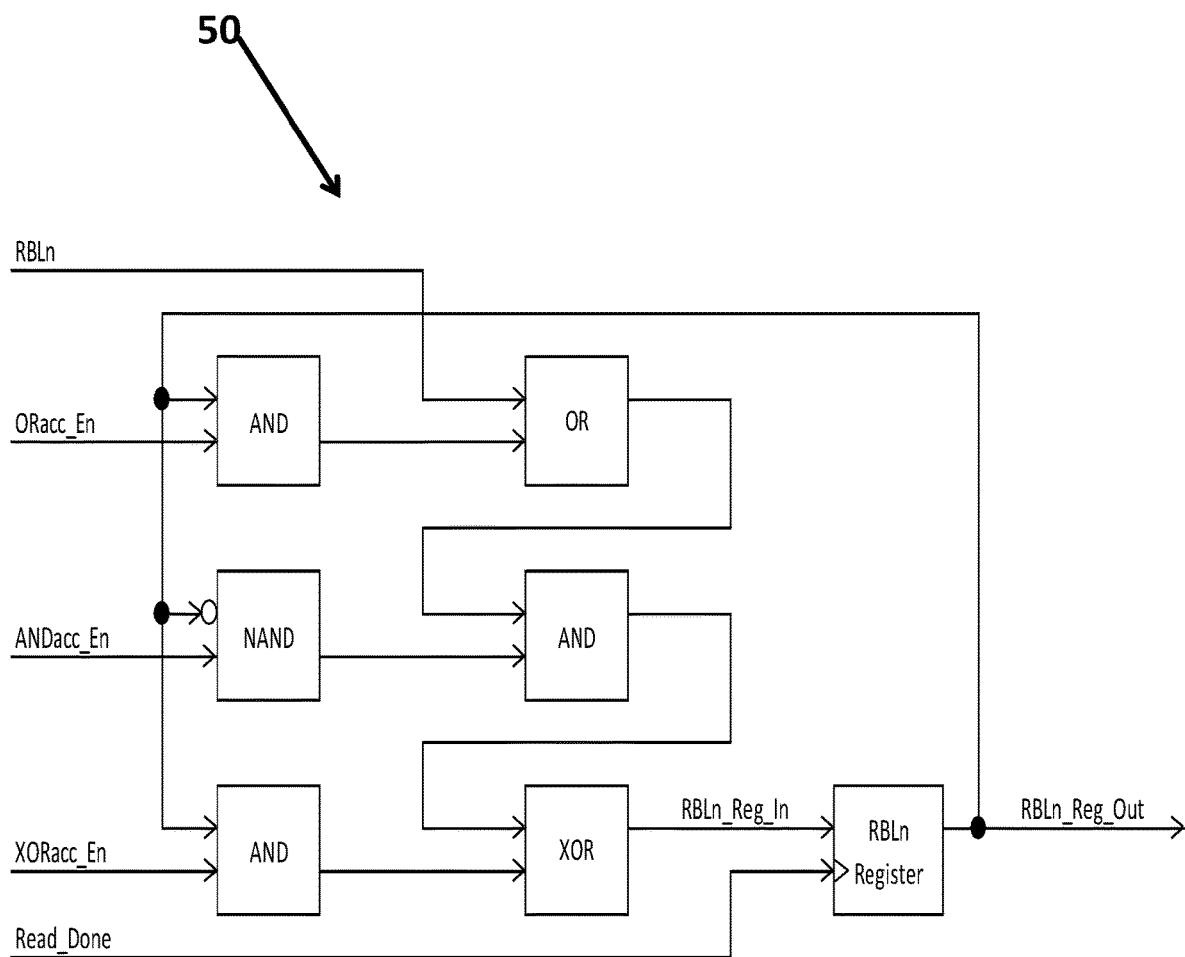
FIG. 13 illustrates a fourth embodiment of the read accumulator circuitry in each bit line read/write logic.

FIG. 13 illustrates a fourth embodiment of the read accumulator circuitry 50 in each bit line read/write logic and FIG. 14 is a truth table showing the operation of the fourth embodiment of the read accumulator circuitry in each bit line read/write logic. This embodiment of the read accumulator combines multiple accumulation circuits to provide a mechanism for even more complex logical functions implemented using the logic gates shown in FIG. 13. Thus, FIG. 13 show an implementation of "XOR accumulation", "AND accumulation", and "OR accumulation". In this embodiment, a dedicated *acc_En control signal is used to enable each of the accumulations—XOR, AND, and OR (as in the previous embodiments and using an ORacc_En, an ANDacc_En and an XORacc_En control signals). The three sets of accumulation circuitry (the AND and OR gates for the OR accumulation, the NAND and AND gates for the AND accumulation and the AND and XOR gates for the XOR accumulation) are chained together such that:

The read bit line result "RBLn" is the first data input to the OR accumulation circuitry.
The data output of the OR accumulation circuitry is the first data input to the AND accumulation circuitry.
The data output of the AND accumulation circuitry is the first data input to the XOR accumulation circuitry.
The data output of the XOR accumulation circuitry is the data input to the read register.

The read register output "RBLn_Reg_Out" is the second data input to the OR accumulation circuitry and the AND accumulation circuitry and the XOR accumulation circuitry.

Although the order in which the accumulation circuits are chained (OR→AND→XOR, as described above) affects the logical function generated by the entire circuit when more than one *acc_En control signal is asserted, it is not an important aspect of this disclosure. Therefore, the disclosure contemplates any order of the accumulation circuitry and any order of the accumulation circuitry is within the scope of this disclosure.

As evident from the Truth Table associated with FIG. 13, as depicted in FIG. 14, when a read operation is performed with all 3 *acc_En control signals=0, the read register is loaded with the read bit line result "RBLn". And when a read operation is performed with one *acc_En=1, the read register is loaded with the read bit line result "RBLn" logically combined (either XORed, ANDed, or ORed, depending on which *acc_En=1) with the previous read result (or accumulated read result) stored in the read register, "RBLn_Reg_Out". Other logical functions are generated when a read operation is performed with multiple *acc_En=1, as depicted in the Truth Table.

In an example, suppose, in this case, the computational memory cells and read bit line circuitry are designed to perform a logical AND across multiple memory cells connected to the same read bit line, when read simultaneously and the read register+XOR/AND/OR accumulation circuitry in FIG. 13 is implemented in conjunction with the read bit line. In that case, the following sequence of three read operations to memory cells A~E connected to the same read bit line produces the following results:

| | |
|---|---|
| Read #1: Read A, B with all *acc_En = 0. | Result: RBLn_Reg_Out = a AND b. |
| Read #2: Read C, D with ORacc_En = 1. | Result: RBLn_Reg_Out = (a AND b) OR (c AND d). |
| Read #3: Read E with XORacc_En = 1. | Result: RBLn_Reg_Out = ((a AND b) OR (c AND d)) XOR e. |

Note: In Read #2 and Read #3, the other *acc_En signals = 0.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

The system and method disclosed herein may be implemented via one or more components, systems, servers, appliances, other subcomponents, or distributed between such elements. When implemented as a system, such systems may include an/or involve, inter alia, components such as software modules, general-purpose CPU, RAM, etc. found in general-purpose computers. In implementations where the innovations reside on a server, such a server may include or involve components such as CPU, RAM, etc., such as those found in general-purpose computers.

Additionally, the system and method herein may be achieved via implementations with disparate or entirely different software, hardware and/or firmware components, beyond that set forth above. With regard to such other components (e.g., software, processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to: software or other components within or embodied on personal computers, servers or server computing devices such as routing/connectivity components, handheld or laptop devices, multiprocessor systems, microprocessor-based systems, set top boxes, consumer electronic devices, network PCs, other existing computer platforms, distributed computing environments that include one or more of the above systems or devices, etc.

In some instances, aspects of the system and method may be achieved via or performed by logic and/or logic instructions including program modules, executed in association with such components or circuitry, for example. In general, program modules may include routines, programs, objects, components, data structures, etc. that performs particular tasks or implement particular instructions herein. The inventions may also be practiced in the context of distributed software, computer, or circuit settings where circuitry is connected via communication buses, circuitry or links. In distributed settings, control/instructions may occur from both local and remote computer storage media including memory storage devices.

The software, circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules and/or other components. Further, communication media may include wired media such as a wired network or direct-wired connection, however no media of any such type herein includes transitory media. Combinations of the any of the above are also included within the scope of computer readable media.

In the present description, the terms component, module, device, etc. may refer to any type of logical or functional software elements, circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive, etc.) to be read by a central processing unit to implement the functions of the innovations herein. Or, the modules can comprise programming instructions transmitted to a general purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, features consistent with the disclosure may be implemented via computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may also be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) though again does not include transitory media. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the applicable rules of law.

While the foregoing has been with reference to a particular embodiment of the disclosure, it will be appreciated by those skilled in the art that changes in this embodiment may be made without departing from the principles and spirit of the disclosure, the scope of which is defined by the appended claims.

The invention claimed is:

1. A circuit, comprising:
   a plurality of computational memory cells each connected to a read bit line, each computational memory cell having an isolation circuit that isolates a data signal representing a piece of data stored in a storage cell from the read bit line; and
   a read accumulation circuit that captures and stores a read result read out on the read bit line from any of the plurality of computational memory cells connected to the read bit line, the read accumulation circuit further comprising a read register and an accumulation circuit whose output is input to the read register to enable an accumulation of read results in the read register over multiple read operations of the plurality of computational memory cells.

2. The circuit of claim 1, wherein the accumulation circuit is an XOR accumulation circuit for XOR accumulation of read results in the read register over multiple read operations.

3. The circuit of claim 2 further comprising a control signal that enables the XOR accumulation circuit.

4. The circuit of claim 3, wherein a first input to the XOR accumulation circuit is the read result and a second input to the XOR accumulation circuit is a read register output signal.

5. The circuit of claim 4, wherein the read register is loaded with the read result when a read operation is performed with the XOR accumulation circuit not being enabled.

6. The circuit of claim 4, wherein the read register is loaded with the read result logically XORed with a previous read result stored in the read register when a read operation is performed with the XOR accumulation circuit enabled.

7. The circuit of claim 1, wherein the accumulation circuit is an AND accumulation circuit for AND accumulation of read results in the read register over multiple read operations.

8. The circuit of claim 7 further comprising a control signal that enables the AND accumulation circuit.

9. The circuit of claim 8, wherein a first input of the AND accumulation circuit is the read result and a second input to the AND accumulation circuit is a read register output.

10. The circuit of claim 9, wherein the read register is loaded with the read result when a read operation is performed with the AND accumulation circuit not being enabled.

11. The circuit of claim 9, wherein the read register is loaded with the read result logically ANDed with a previous read result when a read operation is performed with the AND accumulation circuit being enabled.

12. The circuit of claim 1, wherein the accumulation circuit is an OR accumulation circuit for OR accumulation of read results in the read register over multiple read operations.

13. The circuit of claim 12 further comprising a control signal that enables the OR accumulation circuit.

14. The circuit of claim 13, wherein a first input of the OR accumulation circuit is the read result and a second input to the OR accumulation circuit is a read register output.

15. The circuit of claim 14, wherein the read register is loaded with the read result when a read operation is performed with the OR accumulation circuit not being enabled.

16. The circuit of claim 14, wherein the read register is loaded with the read result logically ORed with a previous read result when a read operation is performed with the OR accumulation circuit being enabled.

17. The circuit of claim 1, wherein the accumulation circuit includes XOR accumulation circuitry, AND accumulation circuitry and OR accumulation circuitry for accumulating read results in the read register over multiple read operations.

18. The circuit of claim 17 further comprising a control signal that enables the XOR accumulation of read results in the read register over multiple read operations.

19. The circuit of claim 18 further comprising a control signal that enables the AND accumulation of read results in the read register over multiple read operations.

20. The circuit of claim 19 further comprising a control signal that enables the OR accumulation of read results in the read register over multiple read operations.

21. The circuit of claim 20, wherein the read result is a first data input to the OR accumulation circuitry, a data output from the OR accumulation circuitry is a first data input to the AND accumulation circuitry, a data output of the AND accumulation circuitry is a first data input to the XOR accumulation circuitry and a data output of the XOR accumulation circuitry is a data input to the read register.

22. The circuit of claim 21, wherein a read register output is a second data input to the OR accumulation circuitry, the AND accumulation circuitry and the XOR accumulation circuitry.

23. The circuit of claim 20, wherein the read register is loaded with the read result when a read operation is performed with the OR accumulation circuitry, the AND accumulation circuitry and the XOR accumulation circuitry all not being enabled.

24. The circuit of claim 20, wherein the read register is loaded with the read result logically XORed with a previous read result stored in the read register when a read operation is performed with the XOR accumulation circuitry being enabled and the AND accumulation circuitry and the OR accumulation circuitry not being enabled.

25. The circuit of claim 20, wherein the read register is loaded with the read result logically ANDed with a previous read result stored in the read register when a read operation is performed with the AND accumulation circuitry being enabled and the OR accumulation circuitry and the XOR accumulation circuitry not being enabled.

26. The circuit of claim 20, wherein the read register is loaded with the read result logically ORed with a previous read result stored in the read register when a read operation is performed with the OR accumulation circuitry being enabled and the AND accumulation circuitry and the XOR accumulation circuitry not being enabled.

27. The circuit of claim 20, wherein the read register is loaded with an inverted read result logically ANDed with a previous read result stored in the read register when a read operation is performed with the AND accumulation circuitry and the XOR accumulation circuitry being enabled and the OR accumulation circuitry not being enabled.

28. The circuit of claim 20, wherein the read register is loaded with the read result logically ANDed with an inverted previous read result stored in the read register when a read operation is performed with the XOR accumulation circuitry and the OR accumulation circuitry being enabled and the AND accumulation circuitry not being enabled.

29. The circuit of claim 20, wherein the read register is loaded with one of the previous read result and an accumulated read result stored in the read register when a read operation is performed with the AND and OR accumulation circuitry being enabled and the XOR accumulation circuitry not being enabled.

30. The circuit of claim 20, wherein the read register is loaded with a logic "0" when a read operation is performed with the XOR, AND and OR accumulation circuitry being enabled.

31. The circuit of claim 1, wherein the plurality of computational memory cells are arranged in an array having a plurality of columns and a plurality of rows and wherein each column of memory cells are all connected to a single read bit line, the circuit further comprises a word line generator that is coupled to a read word line signal and a write word line signal for each memory cell in the array, the word line generator generating one or more control signals that control a logical operation of read accumulation circuit;

a plurality of bit line read and write circuits that are coupled to the single read bit line for each column of memory cells, each bit line read and write circuit having the read accumulation circuit; and wherein the read accumulation circuit captures and stores a read result read out on the read bit line from any of the plurality of computational memory cells connected to the read bit line.

32. The circuit of claim 31, wherein the plurality of memory cells, the word line generator, the plurality of bit line read and write circuits and the read accumulation circuit form a processing array and further comprising a semiconductor memory that contains the processing array.

33. The circuit of claim 31, wherein the plurality of memory cells, the word line generator, the plurality of bit line read and write circuits and the read accumulation circuit form a processing array and further comprising a computer memory within a computer that contains the processing array.

* * * * *